United States Patent
Letz et al.

(10) Patent No.: US 8,859,398 B2
(45) Date of Patent: Oct. 14, 2014

(54) ENHANCING ADHESION OF INTERLAYER DIELECTRIC MATERIALS OF SEMICONDUCTOR DEVICES BY SUPPRESSING SILICIDE FORMATION AT THE SUBSTRATE EDGE

(75) Inventors: Tobias Letz, Dresden (DE); Frank Feustel, Dresden (DE); Kai Frohberg, Niederau (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 239 days.

(21) Appl. No.: 12/749,890

(22) Filed: Mar. 30, 2010

(65) Prior Publication Data

US 2010/0248463 A1 Sep. 30, 2010

(30) Foreign Application Priority Data

Mar. 31, 2009 (DE) .......................... 10 2009 015 749

(51) Int. Cl.
*H01L 21/78* (2006.01)
*H01L 29/66* (2006.01)
*H01L 29/78* (2006.01)
*H01L 21/02* (2006.01)

(52) U.S. Cl.
CPC ........... *H01L 29/665* (2013.01); *H01L 29/7833* (2013.01); *H01L 21/02087* (2013.01)
USPC ..... 438/465; 438/476; 438/664; 257/E21.199

(58) Field of Classification Search
USPC ......... 438/465, 476, 477, 655, 664, 674, 677; 257/E21.199
See application file for complete search history.

(56) References Cited

U.S. PATENT DOCUMENTS

| 6,472,311 B1 | 10/2002 | Shiokawa ...................... 438/630 |
| 6,483,154 B1 | 11/2002 | Ngo et al. ...................... 257/384 |
| 2004/0163762 A1* | 8/2004 | Iizuka et al. ............. 156/345.39 |
| 2007/0264822 A1 | 11/2007 | Kubota et al. ................. 438/660 |

FOREIGN PATENT DOCUMENTS

DE 102005035728 B3 3/2007 ............ H01L 21/283

OTHER PUBLICATIONS

Translation of Official Communication from German Patent Office for German Patent Application No. 10 2009 015 749.2 dated Feb. 10, 2010.

* cited by examiner

*Primary Examiner* — Thanhha Pham
(74) *Attorney, Agent, or Firm* — Amerson Law Firm, PLLC

(57) ABSTRACT

Adhesion of dielectric layer stacks to be formed after completing the basic configuration of transistor elements may be increased by avoiding the formation of a metal silicide in the edge region of the substrate. For this purpose, a dielectric protection layer may be selectively formed in the edge region prior to a corresponding pre-clean process or immediately prior to deposition of the refractory metal. Hence, non-reacted metal may be efficiently removed from the edge region without creating a non-desired metal silicide. Hence, the further processing may be continued on the basis of enhanced process conditions for forming interlayer dielectric materials.

29 Claims, 7 Drawing Sheets

ENHANCING ADHESION OF INTERLAYER DIELECTRIC MATERIALS OF SEMICONDUCTOR DEVICES BY SUPPRESSING SILICIDE FORMATION AT THE SUBSTRATE EDGE

BACKGROUND OF THE INVENTION

1. Field of the Invention

Generally, the present disclosure relates to the fabrication of integrated circuits, and, more particularly, to device structures, such as contact levels and metallization layers.

2. Description of the Related Art

Semiconductor devices are typically formed on substantially disc-shaped substrates made of any appropriate material. The majority of semiconductor devices including highly complex electronic circuits are currently being, and in the foreseeable future will be, manufactured on the basis of silicon, thereby rendering silicon substrates and silicon-containing substrates, such as silicon-on-insulator (SOI) substrates, viable carriers for forming semiconductor devices, such as microprocessors, SRAMs, ASICs (application specific ICs) and the like. The individual integrated circuits are arranged in an array form, wherein most of the manufacturing steps, which may add up to 500-1000 and more individual process steps in sophisticated integrated circuits, are performed simultaneously for all chip areas on the substrate, except for photolithography processes, certain metrology processes and packaging of the individual devices after dicing the substrate. Thus, economic constraints drive semiconductor manufacturers to steadily increase the substrate dimensions, thereby also increasing the area available for producing actual semiconductor devices.

In addition to increasing the substrate area, it is also important to optimize the utilization of the substrate area for a given substrate size so as to actually use as much substrate area as possible for semiconductor devices and/or test structures that may be used for process control. In an attempt to maximize the useful surface area for a given substrate size, the peripheral die regions are positioned as closely to the substrate perimeter as it is compatible with substrate handling processes. Generally, most of the manufacturing processes are performed in an automated manner, wherein the substrate handling is performed at the back side of the substrate and/or the substrate edge, which typically includes a bevel, at least at the front side of the substrate.

Due to the ongoing demand for shrinking the feature sizes of sophisticated semiconductor devices, highly complex and sensitive material layer systems may be increasingly used during the formation of the semiconductor devices. For example, copper and alloys thereof, in combination with low-k dielectric materials and ultra low-k dielectric materials, i.e., dielectric materials having a dielectric constant of approximately 3.0 and significantly less, have become a frequently used alternative for the formation of metallization layers which include metal lines and vias connecting to individual circuit elements by means of a corresponding contact level, which may also be comprised of complex interlayer dielectric materials in combination with contact elements. Although copper exhibits significant advantages compared to aluminum, i.e., a typical metallization material for metal systems of less complex structure, a plurality of challenges is also associated with the employment of copper and complex interlayer dielectric materials. For instance, copper may readily diffuse in silicon, silicon dioxide and a plurality of low-k dielectric materials, which may represent a challenge due to the fact that copper may significantly modify the electrical characteristics of silicon and thus the behavior of circuit elements, such as transistors and the like, even when being present in very small amounts. It is, therefore, essential to confine the copper material to the metal lines and vias by using appropriate insulating and conductive barrier materials that may strongly suppress the diffusion of copper into sensitive device areas and may also reduce the diffusion of reactive components, such as oxygen, fluorine and the like, into the copper metal regions. In addition, a contamination of process tools, such as transport systems, transport containers, robot handlers, wafer chucks and the like, must be effectively restricted since even minute amounts of copper deposited on the back side of a substrate may lead to diffusion of the copper into sensitive device areas. Moreover, due to the employment of low-k dielectric materials in combination with copper, additional problems may have to be dealt with owing to the reduced mechanical stability of the low-k dielectrics. Since at least some of the deposition processes used in fabricating semiconductor devices may not be efficiently restricted to the "active" substrate area, a stack of layers or material residues may also be formed at the substrate edge region including the bevel, thereby generating a mechanically unstable layer stack owing to process non-uniformities at the substrate edge, especially at the bevel of the substrate. Consequently, during the processing of the semiconductor substrates and the handling thereof, an increasing probability of generating any delaminations or flakes may be caused, wherein these material contaminants may be deposited in the central region of the substrate and/or on the back side of substrates and any substrate handling tools, thereby contributing to the contamination of further semiconductor substrates. Hence, although the employment of semiconductor substrates of increased diameter may generally result in an increased overall throughput, the contamination of the substrates in a very late manufacturing stage, i.e., after completing the basic configuration of circuit elements, such as transistors, may nevertheless result in a significant yield loss caused by the insufficient adhesion of complex material systems in the edge region of the semiconductor substrates.

In view of this situation, enhanced process techniques have been developed in which the edge region of the semiconductor substrates may be subjected to dedicated cleaning recipes, for instance on the basis of wet chemical chemistries or plasma assisted atmospheres, where the edge region may be selectively treated while substantially avoiding exposure of the central region, including circuit elements, to the corresponding cleaning processes. For instance, when forming circuit elements, such as transistors and the like, in and above a silicon-containing semiconductor layer, many of the deposition processes required during the complex manufacturing sequence may be substantially restricted to the central region of the semiconductor layer and intermittent spatially selective cleaning processes may be performed, thereby maintaining a substantially unmodified semiconductor surface, which may thus provide superior process conditions with respect to a contamination of the central substrate region comprising the circuit elements in a more or less pronounced manufacturing stage. It appears, however, that upon completing the basic circuit configuration, i.e., after forming a contact structure including interlayer dielectric materials and contact elements, a reduced degree of material adhesion may be observed in the edge region, in particular when complex interlayer dielectric materials in the form of low-k dielectrics may be increasingly deposited since these materials may preferably deposit at the edge region. For this reason, the overall material thickness may increase in the further advance of the manufacturing process, while at the same time the reduced mechanical stability and the overall reduced adhesion may then result in an increasing degree of contamination due to the delamination of material flakes and the like.

The present disclosure is directed to various methods that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure relates to techniques that enable a significant reduction of yield loss during the formation of contact structure and metallization layers of semiconductor devices in which an increased degree of contamination and defects may be observed, which may be caused by insufficient adhesion of sophisticated materials in the edge region of the semiconductor substrate. To this end, it has been recognized that the silicidation process is a major defect source, which may usually be performed after completing the basic transistor structures, i.e., after forming the drain and source regions, in order to enhance overall conductivity of silicon-containing semiconductor areas. Since, typically, the silicon-containing semiconductor material may be exposed in the edge region during the silicidation process, a corresponding chemical reaction may also take place in the edge region, which may thus result in a silicide material, which may finally result in a significant adhesion for materials that may be deposited in later manufacturing stages. In some cases, any changes of existing material systems in contact structures and metallization layers, which may frequently be required due to changes in design and/or functionality of semiconductor devices and the like, may cause a certain degree of non-predictability with respect to the finally achieved performance of the contact structure and metallization layer stack in view of delamination and contamination. Consequently, the techniques disclosed herein provide efficient manufacturing strategies in which the formation of a metal silicide in the semiconductor material of the edge region may be efficiently suppressed, thereby providing superior surface conditions for the deposition of subsequent interlayer dielectric material, conductive barrier materials and the like. For this purpose, an appropriate masking regime may be provided in a late manufacturing stage, i.e., prior to and during the silicidation process, in order to substantially avoid the formation of metal silicide without significantly affecting the overall manufacturing flow. In some illustrative embodiments, a protection layer may be formed selectively in the edge region of the substrate, for instance on the basis of a surface treatment and the like, in order to provide a dielectric surface area that may suppress a chemical reaction with a refractory metal so that the non-reacted refractory metal may be efficiently removed on the basis of well-established etch recipes.

One illustrative method disclosed herein comprises forming a dielectric protection layer in an edge region of a silicon-containing semiconductor layer that is formed above a substrate that has a central region including a plurality of die regions. The method further comprises forming a refractory metal layer above the edge region and the central region. Moreover, a heat treatment is performed so as to initiate the formation of metal silicide in the die regions. Additionally, the method comprises removing the refractory metal layer from above the edge region and dielectric areas in the die regions.

A further illustrative method disclosed herein comprises forming a plurality of circuit elements in and above a silicon-containing semiconductor layer that is formed above a substrate, which has a central region adjacent to an edge region. The method further comprises forming a dielectric protection layer selectively in the edge region so as to mask material of the silicon-containing semiconductor layer in the edge region. Additionally, the method comprises forming a metal silicide in exposed areas of the silicon-containing semiconductor layer.

A still further illustrative method disclosed herein relates to increasing the adhesion of an interlayer dielectric material of a semiconductor device. The method comprises forming circuit elements in a central region of a silicon-containing semiconductor layer. Moreover, the method comprises selectively forming a metal silicide in non-dielectric portions of the circuit elements while covering an edge region of the silicon-containing semiconductor layer. Additionally, the method comprises forming an interlayer dielectric material above the central region and the edge region.

BRIEF DESCRIPTION OF THE DRAWINGS

The disclosure may be understood by reference to the following description taken in conjunction with the accompanying drawings, in which like reference numerals identify like elements, and in which.

Figure 1A:
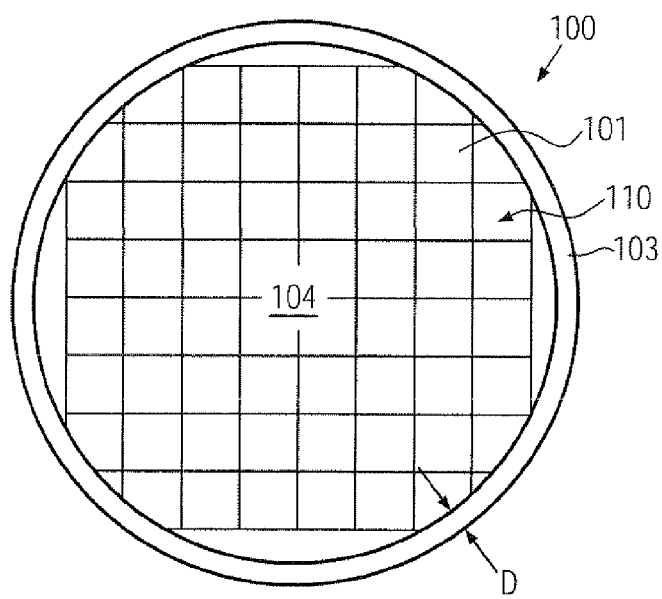
FIG. 1a schematically illustrates a top view of a substrate including a central region and an edge region including a bevel, wherein the central region accommodates a plurality of die regions.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present disclosure relates to a technique that provides enhanced production yield and/or increased uniformity of product performance by significantly reducing the probability of material delamination and contamination caused by insufficient adhesion of dielectric materials in the edge region and the bevel of the substrate. The metal silicide, which may typically be formed in the circuit elements in an advanced manufacturing stage for increasing the conductivity of silicon-containing semiconductor materials, may be formed on the basis of a refractory metal, such as nickel, by performing an appropriate cleaning process on the basis of wet chemical chemistries or plasma assisted recipes in order to prepare exposed surface areas for the deposition of the refractory metal. As previously indicated, in many manufacturing strategies, the edge region may be comprised of a substantially bare semiconductor surface, wherein any additional materials may be efficiently removed during the corresponding pre-clean process so that, after the deposition of the refractory metal, such as nickel and the like, an efficient conversion of silicon material into metal silicide may occur. It turns out, however, that the metal silicide, such as nickel silicide, may cause a reduced adhesion of a plurality of dielectric materials, in particular of silicon nitride materials, silicon dioxide materials and the like, which may typically be used in a subsequent manufacturing stage for forming contact structures. Consequently, due to the inferior adhesion at the edge region of the substrate, the probability of contamination and material delamination may significantly increase during the further processing for forming sophisticated metallization stacks, as previously described. For this reason, the present disclosure provides an efficient manufacturing strategy in which a dielectric protection layer may be selectively formed in the edge region in order to efficiently suppress the formation of metal silicide without unduly contributing to additional process complexity. For this purpose, a dielectric material, such as a nitrogen-containing silicon compound, which may also be referred to as a silicon nitride material, an oxygen-containing silicon compound, which may also be referred to as a silicon oxide material, and the like, may be formed in the edge region, thereby efficiently suppressing a chemical reaction with a refractory metal, which may thus be removed in a subsequent manufacturing step on the basis of well-established etch techniques. In some illustrative embodiments, the dielectric protection layer may be efficiently formed on the basis of well-established process tools, such as wet chemical process tools, plasma assisted process tools, which may selectively act on the edge region of the substrates. Hence, by selecting appropriate recipes, an efficient surface treatment may be accomplished in which a dielectric material may be formed in and on the exposed surface of the silicon-containing semiconductor material in the edge region of the substrate. In some illustrative embodiments, the dielectric protection layer may be selectively formed in the edge region immediately prior to the deposition of the refractory metal or immediately prior to performing a corresponding pre-clean process for conditioning the exposed surface areas for the deposition of the refractory metal. Consequently, any preceding manufacturing processes may remain substantially unaffected by the formation of the dielectric protection layer, thereby providing a high degree of compatibility with conventional process techniques.

FIG. 1a schematically depicts a substrate 100 having a front side 101 on which a plurality of die regions 110 may be formed, each of which may represent a semiconductor device having formed therein circuit elements, such as transistors and the like. Furthermore, the substrate 100 may comprise a back side which is frequently in contact with any type of substrate holders during the transport and processing of the substrate 100. The front side 101 of the substrate 100 may comprise an active or central region 104, which may thus represent the plurality of die regions 110, while an edge region 103, which may also be referred to as an exclusion region, may not be used for the fabrication of circuit elements due to process non-uniformities, substrate handling requirements and the like. The size of the edge region 103 and thus of the central region 104 depends on the controllability of the processes involved in manufacturing circuit elements in and on the central region 104, the capability of transport systems used for supporting and transporting the substrate 100 between subsequent processes and the like. In view of a maximum area utilization of the substrate 100, the size of the edge region 103 may be selected as small as possible to preserve as much substrate area as possible for the die regions 110. Presently 200 mm or 300 mm are typical diameters of the substrate used in modern semiconductor facilities, wherein a width D of the edge region 103 may range from approximately 1-5 mm. Hence, a significant surface area may typically take part in a silicidation process and may result in severe yield losses upon forming contact structures and metallization layers due to the insufficient adhesion of a plurality of dielectric materials on a metal silicide, such as nickel silicide, as previously explained.

Figure 1B:
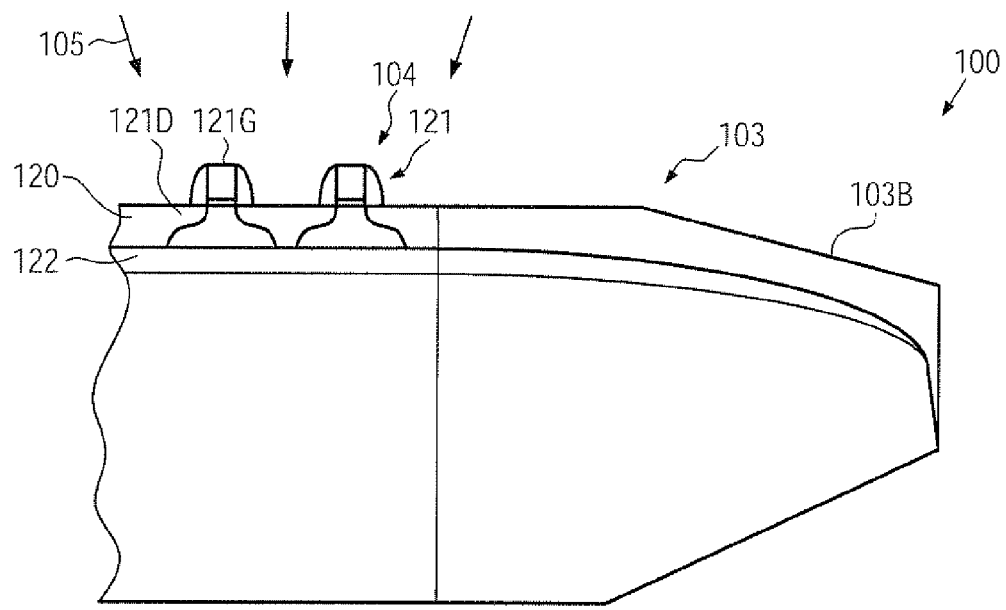
FIG. 1b schematically illustrates a cross-sectional view of a portion of the substrate including a portion of the central region and the edge region including the bevel in an advanced manufacturing stage, i.e., after forming gate electrode structures and prior to performing a silicidation process.

FIG. 1b schematically illustrates a cross-sectional view of the substrate 100 wherein a portion of the central region 104 adjacent to the edge region 103 is illustrated. As shown, the central region 104 and the edge region 103, which may also comprise a bevel 103B, may comprise a silicon-containing semiconductor layer 120, which may be understood as an upper portion of a silicon-based substrate material, while, in other cases, the semiconductor layer 120 may be formed on a buried insulating layer 122 if an SOI configuration is to be used. In the manufacturing stage shown in FIG. 1b, a plurality of circuit elements 121 may be formed in and above the semiconductor layer 120 in the central region 104, while the edge region 103 may have the layer 120 in a substantially exposed state. The circuit elements 121 may comprise transistors, resistors and the like, depending on the overall configuration of semiconductor devices to be formed in the central region 104. In the example shown, the circuit elements 121 may represent field effect transistors comprising gate electrode structures 121G and doped areas in the form of drain and source regions 121D. It should be appreciated that a plurality of dielectric portions may also be provided in the semiconductor layer 120, for instance in the form of isolation structures (not shown), and similarly the circuit elements 121 may comprise dielectric materials, for instance in the form of sidewall spacers and the like.

The circuit elements 121 in the central region 104 may be formed on the basis of any appropriate manufacturing strategy, which may include sophisticated patterning regimes, for instance for forming the gate electrode structures 121G with the required critical dimensions. For instance, a gate length of the structures 121G may be approximately 50 nm and less if sophisticated semiconductor devices may be considered that are formed on the basis of MOS technologies. As previously explained, typically in conductor areas, the circuit elements 121 may receive a metal component in the form of a metal silicide in order to enhance series and contact resistivity of the circuit elements. For instance, in many MOS technologies or any other process techniques, the contact resistivity of circuit portions, such as the drain and source regions 121D, may be reduced by forming a metal silicide at a surface area of these regions. For this purpose, a plurality of refractory metals, such as nickel, platinum and the like, may frequently be used. According to the principles disclosed herein, the metal silicide formation may be restricted to the central region 104, thereby enhancing adhesion of dielectric materials in the edge region 103 during the further processing of the device, as previously explained. Moreover, the substrate 100 may be exposed to a cleaning process 105, which may be performed on the basis of any appropriate cleaning recipe in order to prepare the exposed surface area of the substrate 100 for the deposition of a refractory metal, such as nickel and the like. For example, the cleaning process 105 may be performed on the basis of any appropriate wet chemical recipe in order to remove contaminants, organic residues and the like from exposed portions of the semiconductor layer 120, while, in other cases, plasma assisted cleaning recipes may be used. For example, the cleaning process 105 may comprise a step for removing any oxide residues and the like from exposed portions of the semiconductor layer 120 in order to ensure a continuous silicidation in a subsequent manufacturing stage.

Figure 1C:
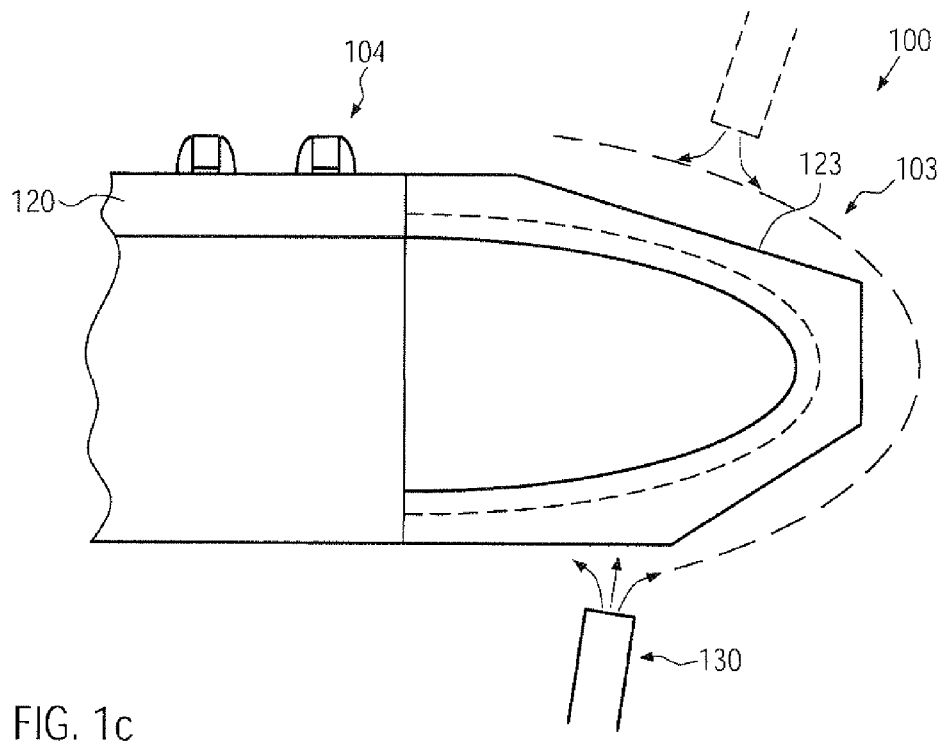
FIGS. 1c-1d schematically illustrate cross-sectional views of the semiconductor device during various strategies for selectively forming a dielectric protection layer in the edge region and the bevel of the substrate on the basis of a surface treatment, according to illustrative embodiments.

FIG. 1c schematically illustrates a cross-sectional view of the substrate 100 when exposed to a spatially restricted process ambient 130, which may be appropriately configured so as to form a dielectric protection layer in the edge region 103. For example, a plurality of well-established process tools, including an appropriate nozzle system, are available, which may be used for treating the edge region 103 of the substrate 100 during various manufacturing stages. In the embodiment shown in FIG. 1c, a corresponding process tool configured for supplying wet chemical agents may be efficiently used for establishing the process ambient 130. For example, in the ambient 130, a spatially restricted exposure to well-established cleaning agents may be initiated in order to perform an efficient surface treatment of the semiconductor layer 120 in the edge region 103. In some illustrative embodiments, wet chemical agents causing oxidation of the semiconductor layer 120 may be used, for instance, in the form of hydrogen peroxide in combination with sulphuric acid, ammonium hydroxide, HCL and the like. That is, upon application of one or more of these agents, a silicon oxide-based material may be formed in a surface area that is exposed to the process ambient 130, thereby forming the dielectric protection layer 123, while at the same time efficiently removing any contaminants such as resist residues and the like.

Figure 1D:
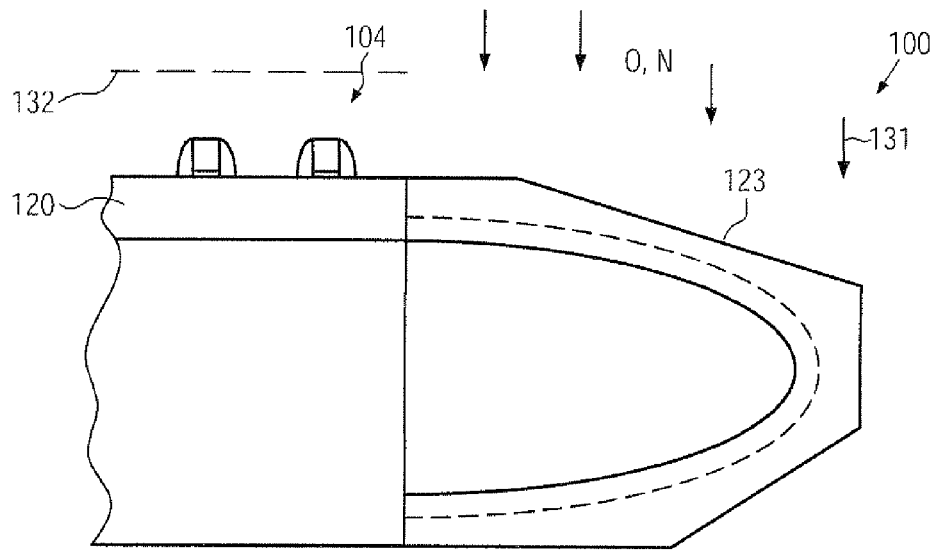

FIG. 1d schematically illustrates the substrate 100 according to further illustrative embodiments in which the spatially restricted dielectric protection layer 123 may be formed on the basis of a process ambient 131 that is established by using a plasma atmosphere. For example, an oxygen-or nitrogen-containing plasma ambient may be established such that exposure to the plasma may be substantially restricted to the edge region 103, which may be accomplished by dedicated process tools, for instance, including a corresponding mask element 132, which may efficiently shield the central region 104. Consequently, a nitrogen-containing compound may be formed in the protection layer 123 on the basis of a nitrogen-containing plasma ambient, while, in other cases, an oxygen-containing compound, i.e., a silicon oxide material, may be formed in the exposed portion of the semiconductor layer 120. Hence, also in this case, a dielectric surface area in the form of the protection layer 123 may be achieved in a highly spatially selective manner on the basis of the plasma assisted process ambient 131.

Figure 1E:
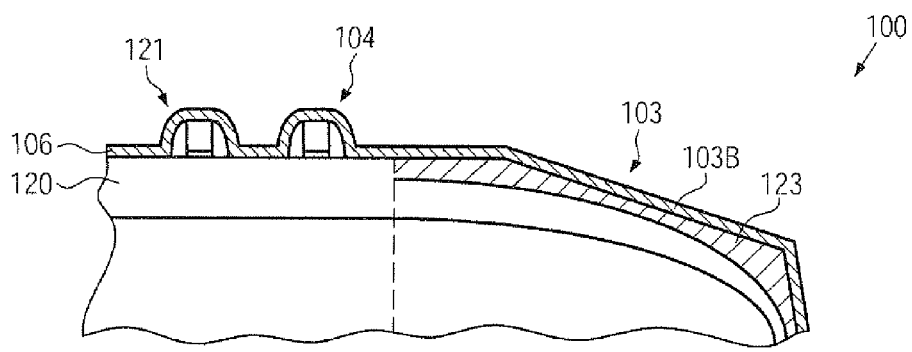
FIGS. 1e-1g schematically illustrate cross-sectional views of the semiconductor device during various manufacturing stages in selectively forming a metal silicide in the central region, while efficiently suppressing the formation of metal silicide in the edge region, according to illustrative embodiments.

FIG. 1e schematically illustrates the substrate 100 after the deposition of a layer of refractory metal 106, which may comprise any appropriate metal, such as nickel, platinum and the like, as may be required for obtaining a desired contact resistivity for the circuit elements 121. As illustrated, typically, a significant portion of the metal 106 may also be deposited above the edge region 103 and the bevel 103B, since the deposition may not be efficiently restricted to the central region 104 only. Thus, at the edge region 103, the metal 106 may be formed on the dielectric protection layer 123, which may thus efficiently suppress a chemical reaction during the subsequent manufacturing stage.

Figure 1F:
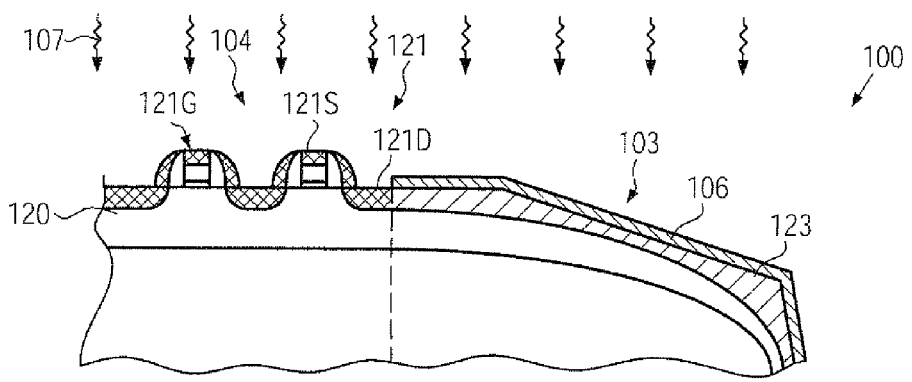

FIG. 1f schematically illustrates the substrate 100 when exposed to a heat treatment 107 that is appropriately designed to initiate a chemical reaction between the metal 106 and exposed surface areas of the semiconductor layer 120. As illustrated, during the heat treatment 107, metal silicide regions 121S may be formed, for instance, in the gate electrode structures 121G, if comprised of a silicon-containing material, and in the drain and source regions 121D, while, above dielectric portions of the circuit elements 121, the metal 106 may substantially not take part in a corresponding chemical reaction. Similarly, the metal 106 may be maintained on the dielectric protection layer 123 in the edge region 103.

Figure 1G:
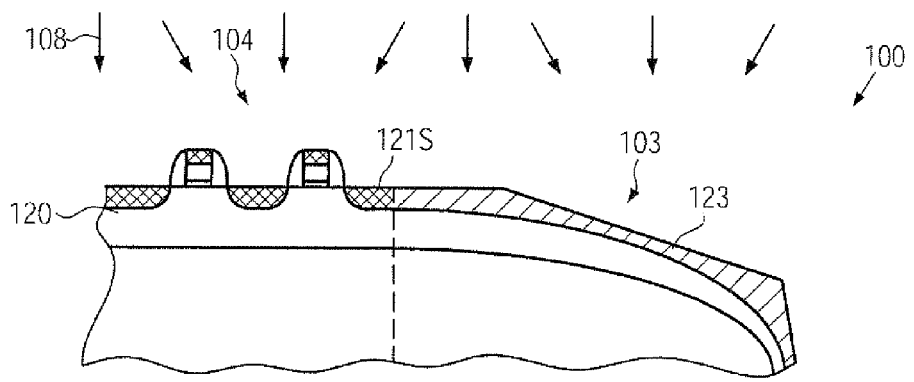

FIG. 1g schematically illustrates the substrate 100 during a subsequent selective etch process 108 which may be performed on the basis of well-established wet chemical recipes in order to remove non-reacted metal selectively to the metal silicide regions 121S and dielectric surface areas, such as the protection layer 123. Consequently, the further processing of the substrate 100 may be continued without a metal silicide in the edge region 103, thereby enhancing adhesion of dielectric materials to be formed in a later manufacturing stage, as will be described later on in more detail.

Figure 1H:
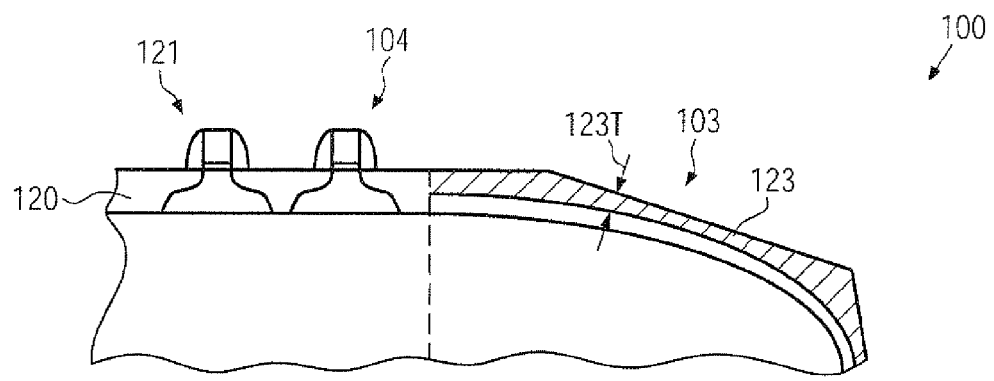
FIGS. 1h-1l schematically illustrate cross-sectional views of the semiconductor device during various manufacturing stages for forming a dielectric protection layer selectively in the edge region of the substrate prior to performing a pre-clean process for preparing exposed surface areas for the deposition of a refractory metal, according to still further illustrative embodiments.

FIG. 1h schematically illustrates the substrate 100 according to further illustrative embodiments in which the protection layer 123 may be formed prior to performing a cleaning process for preparing exposed semiconductor surfaces for the deposition of a refractory metal. As illustrated, the substrate 100 may comprise the dielectric protection layer 123 in the edge region 103, which may be accomplished by using an appropriate spatially restricted treatment, such as the processes 130, 131 as described with reference to FIGS. 1c and 1d. During the corresponding process for forming the protection layer 123, a thickness 123T thereof is approximately selected such that a material removal during a subsequent cleaning process may not result in an exposure of the semiconductor layer 120. For this purpose, the process parameters for forming the layer 123 may be appropriately selected, for instance, by selecting a corresponding process time for a given recipe, in order to obtain the thickness 123T. For instance, the thickness 123T may range from approximately 5-50 nm or even more, depending on the material consumption of the subsequent cleaning process.

Figure 1I:
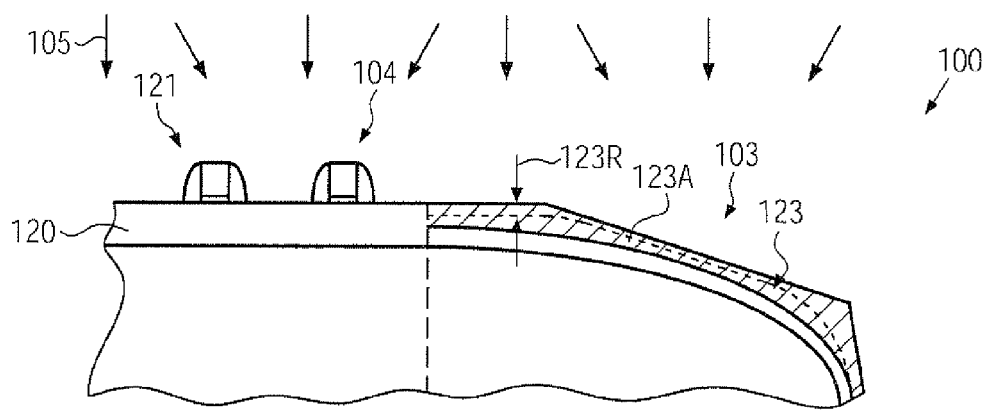

FIG. 1i schematically illustrates the substrate 100 when exposed to the cleaning ambient 105, in which organic residues, particles, oxide residues and the like may be efficiently removed, as is also previously explained with reference to FIG. 1b. Consequently, during the cleaning process 105, a surface layer of the protection layer 123 may also be removed, as indicated by 123R, however, without completely etching through the layer 123. Consequently, a portion 123A may be reliably maintained so as to cover the semiconductor layer 120 in the edge region 103.

Figure 1J:
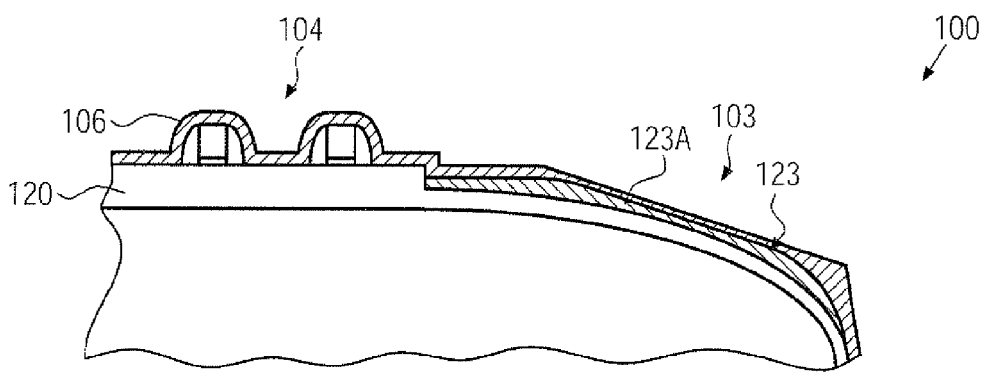

FIG. 1j schematically illustrates the substrate 100 in a further advanced manufacturing stage in which the layer of refractory metal 106 may be deposited above the central region 104 and the edge region 103 that comprises the dielectric protection layer 123A. Since the cleaning process 105 (FIG. 1i) may be performed immediately prior to the deposition of the layer 106, enhanced surface conditions may be provided, irrespective of any influences caused in the central region 104 in the vicinity of the edge region 103 during the formation of the dielectric protection layer 123.

Figure 1K:
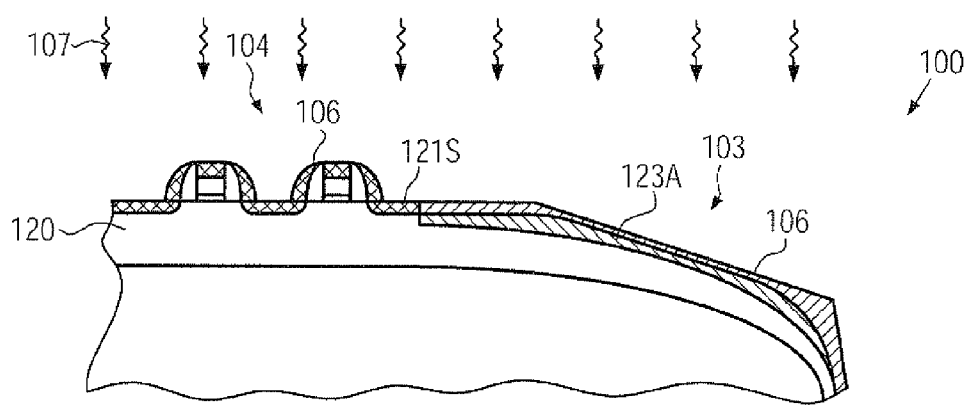

FIG. 1k schematically illustrates the substrate 100 during the heat treatment 107 for forming the metal silicide regions 121S in the central region 104, while the dielectric protection layer 123A reliably suppresses the formation of metal silicide in the edge region 103, as previously explained.

Figure 1L:
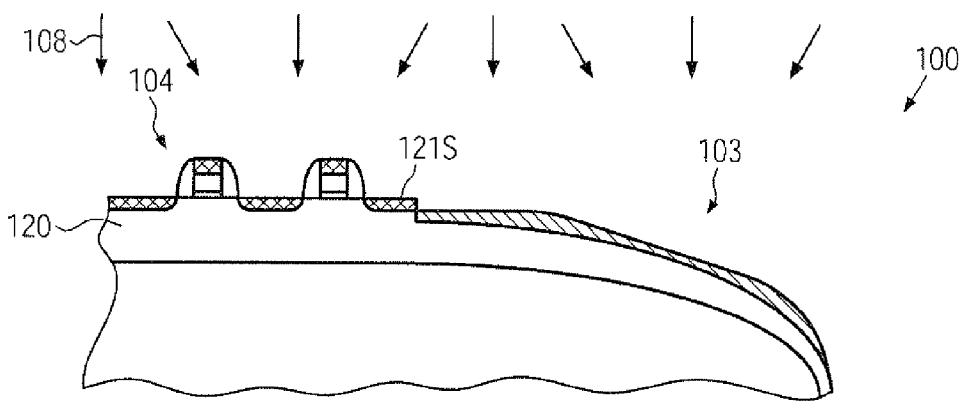

FIG. 1l schematically illustrates the substrate 100 when exposed to the selective etch ambient 108 for removing the non-reacted portion of the metal 106 (FIG. 1k).

Figure 1M:
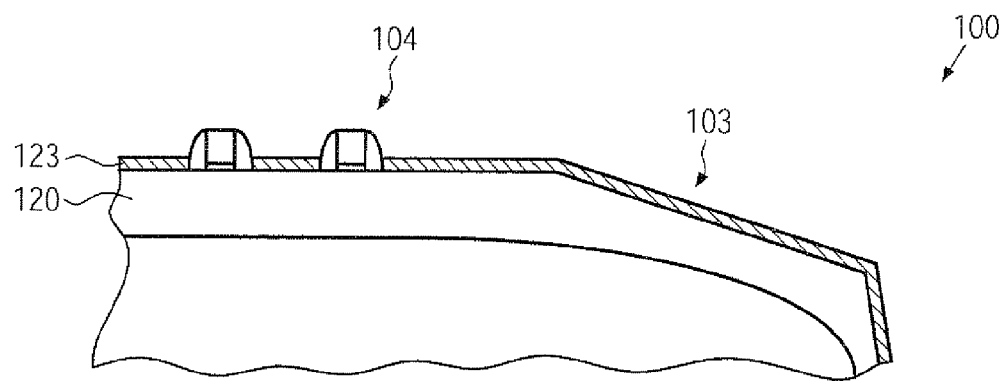
FIGS. 1m-1n schematically illustrate cross-sectional views of the semiconductor device according to still further illustrative embodiments in which a dielectric protection layer may be formed on the entire substrate and may then be selectively removed in the central region on the basis of an efficient pre-clean process for preparing exposed surface areas for the deposition of a refractory metal.
Figure 1N:
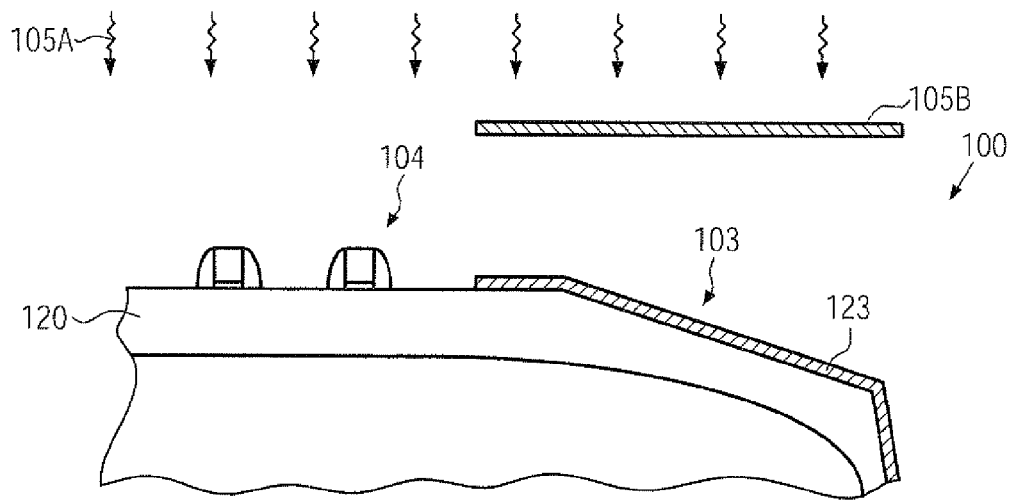

With reference to FIGS. 1m-1n, further illustrative embodiments will now be described in which the protection layer may be initially formed in the central region and the edge region and may be subsequently removed from the central region, for instance during a cleaning process for conditioning the semiconductor layer for the subsequent deposition of a refractory metal.

FIG. 1m schematically illustrates the substrate 100 when exposed to an appropriate process ambient for forming a dielectric material 123, at least on exposed surface portions of the semiconductor layer 120. For instance, in some illustrative embodiments, the treatments 130 or 131 as previously explained with reference to FIGS. 1c and 1d, respectively, may be applied in order to form an oxide-based or nitride-based protection layer 123 in the regions 104, 103. In this case, the layer 123 may be selectively formed in the semiconductor material, while other dielectric portions in the central region 104 may not be significantly affected, thereby providing a high degree of process compatibility with conventional strategies. In other cases, the layer 123 may be formed, for instance, by deposition and the like so that the protection layer 123 may also be formed above dielectric portions in the central region 104. For instance, a silicon dioxide layer, silicon nitride layer and the like may be deposited on the basis of well-established chemical vapor deposition (CVD) techniques. In still other cases, a thermally activated oxidation process may be performed in order to selectively form the layer 123 in exposed surface areas of the semiconductor layer 120.

FIG. 1n schematically illustrates the substrate 100 when exposed to a cleaning ambient 105A in order to prepare the semiconductor layer 120 in the central region 104 for the deposition of a refractory metal. In the embodiment shown, the cleaning ambient 105A may be established on the basis of a plasma atmosphere using well-established recipes, for instance for removing oxidized portions and the like. Moreover, a shield 105B may be provided in the plasma assisted atmosphere 105A so as to substantially restrict the ambient 105A to the central region 104, thereby substantially completely maintaining the dielectric protection layer 123 in the edge region 103. Consequently, after the cleaning process 105A, the refractory metal may be deposited, as previously described. Thereafter, the conversion of metal into metal silicide may be restricted to the central region 104 due to the protection layer 123, as discussed above.

Figure 1O:
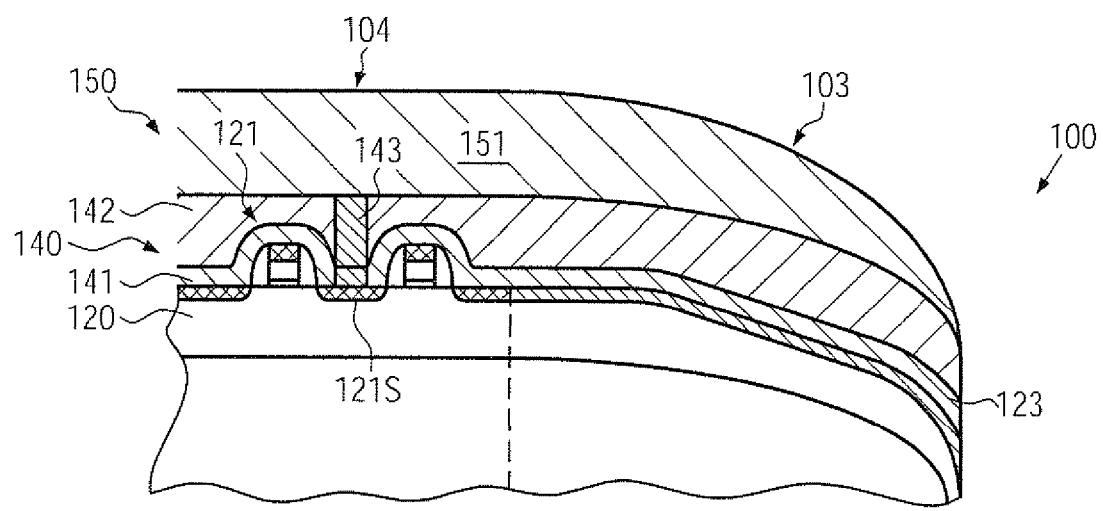
FIG. 1o schematically illustrates the semiconductor device in a further advanced manufacturing stage in which one or more interlayer dielectric materials may be formed in the central region and the edge region with enhanced adhesion, according to illustrative embodiments.

FIG. 1o schematically illustrates the substrate 100 in a further advanced manufacturing stage. As illustrated, a contact level 140 may be formed in the central region 104 and may comprise one or more interlayer dielectric materials 141, 142, for instance in the form of silicon nitride, silicon dioxide and the like. Furthermore, a contact element 143 may be formed in the dielectric materials 141, 142 in accordance with device requirements. For example, the contact element 143 may be comprised of any appropriate metal, such as tungsten, copper, aluminum and the like, as may be required. Moreover, the dielectric materials 141, 142 may also be formed in the edge region 103, wherein, however, superior adhesion of these materials may be ensured due to the lack of any metal silicide. In the embodiment shown, the dielectric protection layer 123 may still be present in the edge region 103 and may thus act as a base material for forming thereabove the dielectric materials 141 and 142. In other illustrative embodiments (not shown), the protection layer 123 may be removed prior to the deposition of the materials 141, 142, which may be accomplished by selectively applying an etch ambient to the edge region 103, wherein similar process tools may be used as previously explained with reference to FIGS. 1c and 1d. Moreover, in the manufacturing stage shown, a further metallization level 150 may be provided, for instance comprising a dielectric material 151, such as a low-k dielectric material and the like.

The substrate 100 as illustrated in FIG. 1o may be formed on the basis of any appropriate manufacturing strategy in which, for instance, the interlayer dielectric materials 141 and 142 may be deposited, for instance by plasma enhanced CVD techniques, subatmospheric CVD and the like. For instance, one or more of the materials 141, 142 may be provided in the form of a highly stressed dielectric material in order to enhance performance of some of the circuit elements 121. After the deposition of the materials 141, 142, possibly in combination with a planarization process, the dielectric materials may be patterned in order to form the contact element 143. It should be appreciated that, typically, the planarization of any interlayer dielectric materials may include a chemical mechanical polishing (CMP) process, during which the enhanced adhesion of the materials 141, 142 in the edge region 103 may significantly contribute to enhanced process conditions due to the superior mechanical stability of a layer stack in the edge region 103. Similarly, after the deposition and patterning of the interlayer dielectric material 151 of the metallization layer 150, appropriate conductive materials, such as barrier materials, copper and the like, may be deposited and may also be planarized on the basis of CMP techniques, thereby also providing superior process conditions.

As a result, the present disclosure provides techniques for enhancing process conditions for forming complex contact structures and metallization systems by increasing adhesion of dielectric materials in the edge region of the substrates by avoiding formation of a metal silicide in the edge region. For this purpose, an appropriate dielectric protection layer may be provided selectively in the edge region prior to depositing the refractory metal, which may be accomplished on the basis of wet chemical surface treatments, plasma assisted surface treatments, the deposition of appropriate materials and the like.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a dielectric protection layer in an edge region of a silicon-containing semiconductor layer, said semiconductor layer being formed above a substrate and having a central region including a plurality of die regions, wherein forming said dielectric protection layer comprises exposing said edge region and said central region to substantially the same process ambient so as to form a dielectric layer above said edge region and said central region and selectively removing said dielectric layer from above said central region, wherein after selectively removing said dielectric layer from above said central region, said dielectric layer formed above said edge region covers an entirety of said edge region and exposes said die regions for metal silicide formation;
    after forming said dielectric protection layer in said edge region, forming a refractory metal layer above said edge region and said central region;
    performing a heat treatment so as to initiate said metal silicide formation in said die regions; and
    removing said refractory metal layer from above said edge region and dielectric areas in said die regions.

2. The method of claim 1, wherein forming said dielectric protection layer comprises treating a surface of said silicon-containing semiconductor layer by at least one of a wet chemical treatment and a plasma assisted treatment.

3. The method of claim 2, wherein treating said surface of said silicon-containing semiconductor layer comprises forming at least one of a silicon dioxide material and a nitrogen-containing silicon material.

4. The method of claim 1, wherein selectively removing said dielectric layer from above said central region comprises cleaning non-dielectric portions in said central region for receiving said refractory metal layer.

5. The method of claim 4, wherein cleaning said non-dielectric portions comprises performing a plasma assisted cleaning process and using a mask for selectively blocking said plasma ambient from said edge region.

6. The method of claim 1, further comprising performing a cleaning process after forming said dielectric protection layer and prior to forming said refractory metal layer.

7. The method of claim 6, wherein said dielectric protection layer is formed with a thickness that is greater than a thickness of a material removed from said dielectric protection layer during said cleaning process.

8. The method of claim 1, further comprising performing a cleaning process for preparing said central region for forming said refractory metal layer after forming said dielectric protection layer.

9. The method of claim 1, further comprising forming gate electrode structures of transistor elements above said central region prior to forming said dielectric protection layer.

10. The method of claim 1, further comprising forming an interlayer dielectric material above said central region and said edge region after forming said metal silicide in said die regions.

11. The method of claim 1, wherein said refractory metal layer comprises nickel.

12. The method of claim 1, wherein forming said dielectric layer above said edge region and said central region comprises depositing said dielectric layer by performing a material deposition process.

13. The method of claim 12, wherein said dielectric layer is deposited above said edge region and said central region during a same material deposition step.

14. The method of claim 1, wherein said edge region and said central region are exposed to said substantially the same process ambient during a same processing step.

15. The method of claim 14, wherein exposing said edge region and said central region to said substantially the same process ambient comprises performing an oxidation process.

16. A method, comprising:
    forming a plurality of circuit elements in and above a silicon-containing semiconductor layer formed above a substrate, said substrate having a central region adjacent to an edge region;
    forming a dielectric protection layer selectively in said edge region so as to mask material of said silicon-containing semiconductor layer in said edge region, wherein forming said dielectric protection layer comprises performing a common material deposition process to deposit a dielectric layer above said edge region and said central region during a same deposition step and selectively removing said dielectric layer from above said central region, wherein after selectively removing said dielectric layer from above said central region, said dielectric layer formed above said edge region covers an entirety of said edge region and exposes areas of said silicon-containing semiconductor layer for metal silicide formation; and after forming said dielectric protection layer selectively in said edge region, forming a metal silicide in said exposed areas of said silicon-containing semiconductor layer.

17. The method of claim 16, wherein forming said metal silicide comprises performing a cleaning process for preparing said central region and said edge region for receiving a layer of refractory metal, depositing said layer of refractory metal and initiating a chemical reaction between said refractory metal and silicon of non-dielectric portions of said silicon-containing semiconductor layer.

18. The method of claim 17, wherein said dielectric protection layer is formed prior to performing said cleaning process.

19. The method of claim 18, wherein said layer of refractory metal comprises nickel.

20. The method of claim 16, wherein performing said common material deposition process comprises performing a chemical vapor deposition process.

21. The method of claim 16, wherein depositing said dielectric layer comprises depositing at least one of an oxygen-containing silicon compound and a nitrogen-containing silicon compound.

22. The method of claim 16, wherein selectively removing said dielectric layer comprises shielding said edge region while exposing said central region to a cleaning ambient.

23. A method of increasing adhesion of an interlayer dielectric material of a semiconductor device, the method comprising:
  forming circuit elements in a central region of a silicon-containing semiconductor layer formed above a substrate;
  selectively forming a metal silicide in non-dielectric portions of said circuit elements while covering an edge region of said silicon-containing semiconductor layer, wherein covering said edge region comprises exposing said edge region and said central region to substantially the same process ambient so as to form a dielectric protection layer above said edge region and said central region of said silicon-containing semiconductor layer, and selectively removing said dielectric protection layer from above said central region, wherein after selectively removing said dielectric protection layer from above said central region, said dielectric protection layer formed above said edge region covers an entirety of said edge region and exposes areas of said silicon-containing semiconductor layer for said selectively forming said metal silicide; and
  forming an interlayer dielectric material above said central region and said edge region.

24. The method of claim 23, wherein said dielectric protection layer is formed by at least one of a wet chemical treatment and a plasma assisted treatment.

25. The method of claim 24, wherein selectively forming said metal silicide comprises performing a cleaning process and depositing a layer of refractory metal and wherein said dielectric protection layer is formed prior to performing said cleaning process.

26. The method of claim 24, wherein selectively forming said metal silicide comprises performing a cleaning process and depositing a layer of refractory metal and wherein said dielectric protection layer is formed after performing said cleaning process.

27. The method of claim 23, wherein forming said dielectric protection layer above said edge region and said central region comprises depositing said dielectric protection layer by performing a material deposition process.

28. The method of claim 27, wherein said dielectric protection layer is deposited in said edge region and said central region during a same material deposition step.

29. The method of claim 23, wherein said edge region and said central region are exposed to said substantially the same process ambient during a same processing step.

* * * * *